United States Patent [19]

Lee

[11] Patent Number: 5,162,681
[45] Date of Patent: Nov. 10, 1992

[54] DIFFERENTIAL SENSE AMPLIFIER

[75] Inventor: Jeong-Ryeol Lee, Suwon, Rep. of Korea

[73] Assignee: Samsung Electronics Co., Ltd., Suwon, Rep. of Korea

[21] Appl. No.: 642,872

[22] Filed: Jan. 18, 1991

[30] Foreign Application Priority Data

Dec. 12, 1990 [KR] Rep. of Korea ............... 1990-20393

[51] Int. Cl.$^5$ ............................................. G11C 7/00
[52] U.S. Cl. ................................. 307/530; 365/189.11
[58] Field of Search ................... 307/350, 530, 540; 330/253, 277; 365/189.11

[56] References Cited

U.S. PATENT DOCUMENTS

| | | | |
|---|---|---|---|
| 4,984,204 | 1/1991 | Sato et al. | 307/530 X |
| 5,017,815 | 5/1991 | Shah et al. | 307/530 X |
| 5,053,652 | 10/1991 | Sato et al. | 307/530 |

OTHER PUBLICATIONS

West, N. H. E. et al. "8.5.7 Read/Write circuitry", in: *PRINCIPLES OF CMOS VLSI DESIGN A Systems Perpsective*, pp. 362-364 (1988).

Primary Examiner—Steven Mottola
Attorney, Agent, or Firm—Robert E. Bushnell

[57] ABSTRACT

There is disclosed a differential sense amplifier for amplifying a small voltage difference between a pair of input signals including: a pair of first complementary drivers for producing signals of different states in response to the pair of input signals and determining the voltage level including one of the pair of input signals; a pair of output terminals connected with the respective outputs of the pair of complementary drivers; and a pair of a second complementary drivers connected between the pair of output terminals to respectively respond to the signals of different states of the first complementary drivers. Each of the first and second complementary drive means includes two insulated gate transistors connected in series and having different operating voltages. A feedback may be provided between the pair of output terminals for fast charging with the power supply voltage and bi-stable output operation. The inventive sense amplifier provides low power consumption, high performance speed and high output voltage gain.

28 Claims, 9 Drawing Sheets (PRIOR ART)
FIG. 1

DIFFERENTIAL SENSE AMPLIFIER

BACKGROUND OF THE INVENTION

The present invention generally concerns a differential sense amplifier used in a semiconductor memory device. In particular, this invention relates to a sense amplifier which may have stable, good amplification characteristics, without causing great power cosumption.

A semiconductor memory device requires, in order to read out the data stored in its memory cells, a circuit for decoding addresses to select a series of memory cells, an amplifier for amplifying the data read out from the selected memory cells, and a circuit outputting the amplified data. Generally, when fabricating a highly integrated semiconductor memory device with high speed performance, the improvement of its reliability as well as the least power cosumption must be primarily considered.

Particularly, as the semiconductor memory device gets more highly integrated, both of the operating voltage level of the memory device and the voltage difference between the data lines get reduced, so that there is required a sense amplifier to surely sense the reduced voltage difference. The amplifiers used mainly in a semiconductor memory device, particularly a static random access memory (SRAM), are differential sense amplifiers, which are to amplify the small voltage difference between both input terminals of a pair of data lines (bit lines).

Such a sense amplifier is generally of a current mirror type, whose fundamental structure is disclosed in U. S. Pat. No. 4,697,112 and the article entitled "A 28ns CMOS SRAM With Bipolar Sense Amplifiers", PP 224–225, IEEE ISSCC published on Feb. 23, 1984.

Figure 1:
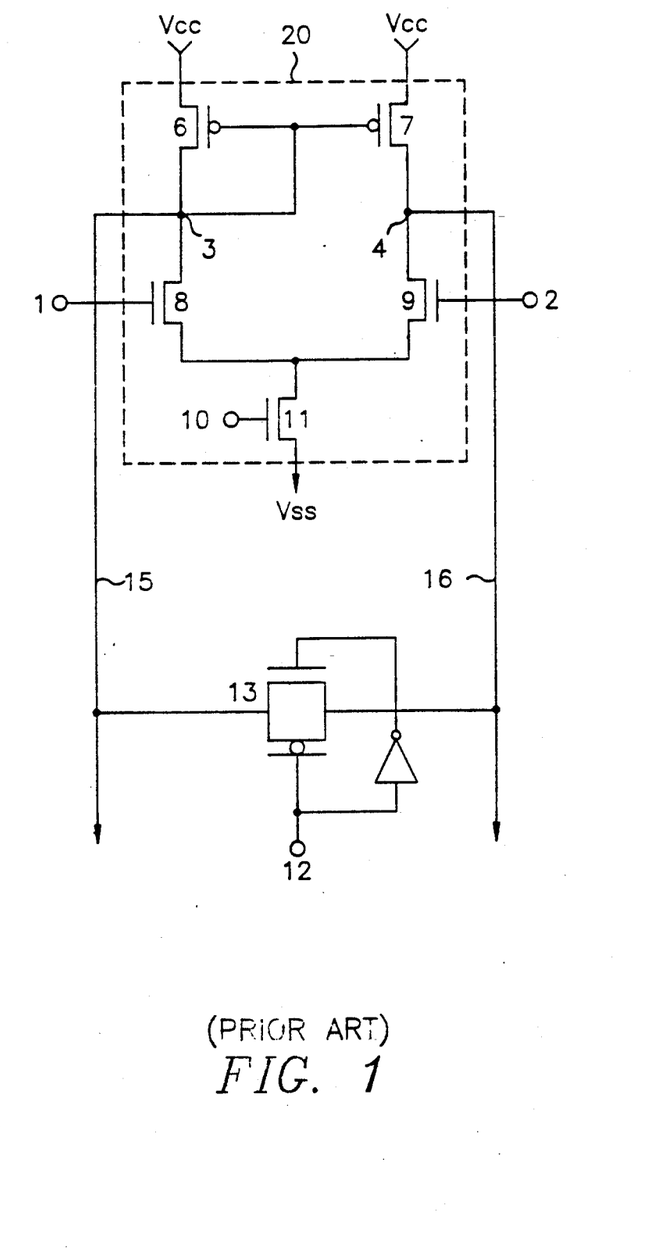
FIG. 1 illustrates a basic form of a conventional differential sense amplifier.

Referring to FIG. 1 for illustrating a conventional circuit including the sense amplifier disclosed in the above publications, the circut amplifies the difference between the voltages applied to first and second input terminals 1 and 2, which are output through a first and second output terminals 3 and 4. Since there is no substantial voltage difference between the gate and drain of a p-channel metal oxide semiconductor (PMOS) transistor 6 that are commonly connected with each other, the voltage of the first output terminal 3 does not suffer a considerable change in spite of variation of the input signal level.

Thus, the effective output is obtained through only the second output terminal 4, and therefore the circuit is called a single ended type. Hence, a practical memory device uses two single ended current mirror type sense amplifiers, as shown in FIG. 2.

Figure 2:
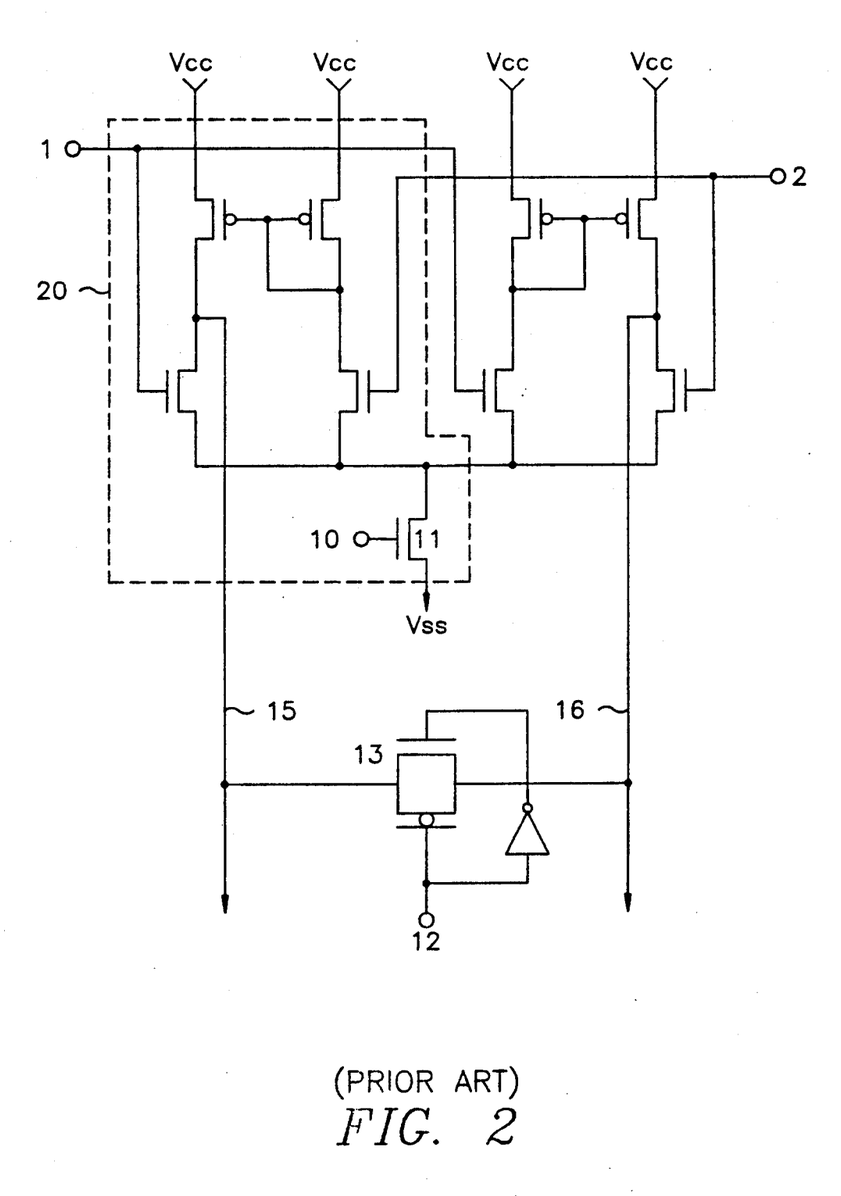
FIG. 2 is an embodiment of the conventional circuit.

In FIGS. 1 and 2, an N-type metal oxide semiconductor (NMOS) transistor 11 with the source coupled to the ground voltage Vss is to prevent power consumption in respomse to a sense amplifier control signal 10 of the logic "low" state received by its gate when sense amplifier is not operated.

The equalization signal 12 applied to an equalization transmission gate 13 connected between a pair of bit lines (or data lines) 15 and 16 equalizes the bit lines 15 and 16 before and after the operation of the sense amplifier, while becoming the logic "high" so as to cause the output signal of the sense amplifier to appear in the bit lines (or data lines) during the operation thereof.

Using the above current mirror type sense amplifier involves the following problems.

First, if the voltage level of the input signals is relatively low or high, the gain of out put voltage becomes small. The reason is that although no problem would be caused if there would be formed a voltage difference between the input voltages including the threshold voltages of the NMOS transistors 8 and 9 (See FIG. 1) receiving the input voltages, however the voltage difference between the first and second output terminals 3 and 4 becomes insignificant because the NMOS transistors have almost same conductivity if the levels of the two inputs are different below or over the threshold voltage.

Second, the operation speed is very low. The reason is that if the signal received through the first input terminal 1 has a higher level than the signal received through the second input terminal 2, the NMOS transistor 8 gets into the conductive state faster compared with the normal state, thereby lowering the voltage of the first output terminal 3. Consequently, the PMOS transistor 7 charges the second output terminal 4 with the power supply voltage Vcc, so that the variation of output voltages is caused. The time taken for the variation depends on the conductivity of the transistor itself, so that the effective output appears relatively slow.

Figure 3:
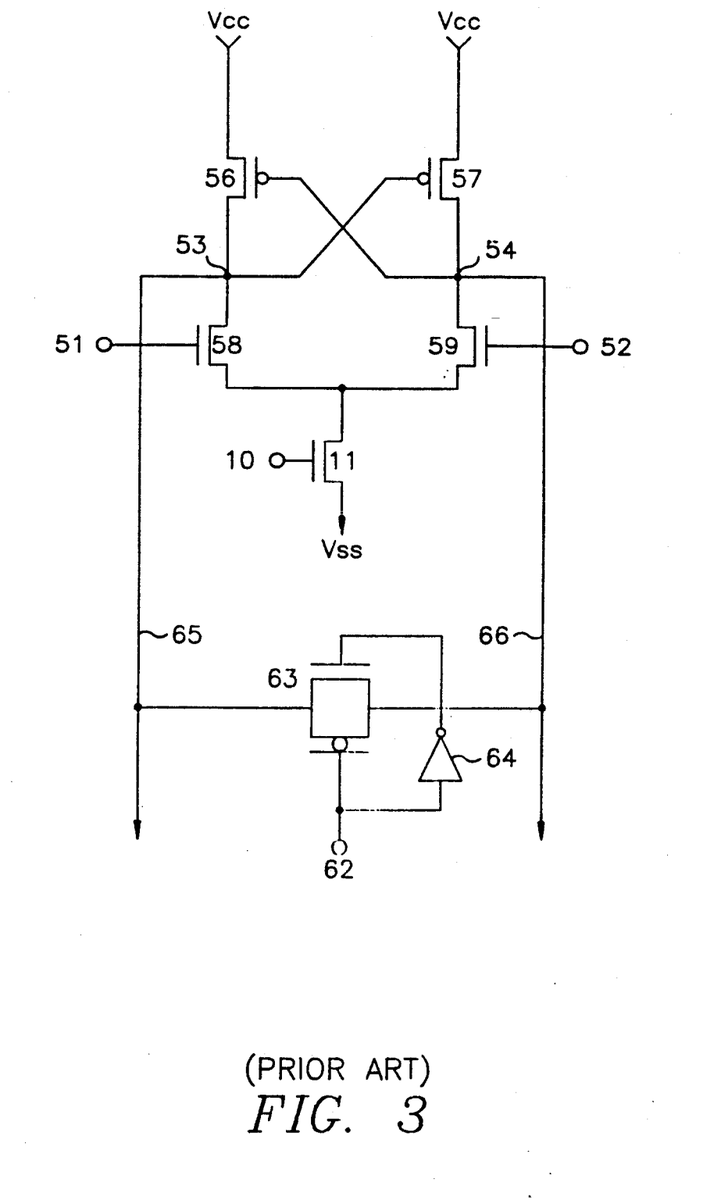
FIG. 3 is another embodiment of the conventional circuit.

In order to improve the current mirror type sense amplifier, there has been proposed another conventional sense amplifier as shown in FIG. 3.

The latch type sense amplifier as shown in FIG. 3 has a first and second output terminals 53 and 54 cross-coupled respectively to the gates of PMOS transistors 57 and 56.

This structure is to compensate for the insufficient positive feedback effect of the first states prior art that is caused by the PMOS transistors 6, 7 coupled to the power supply in the circuit of FIGS. 1 and 2 working in the saturation region. However, the sense amplifier of FIG. 3 also shows dropping of the output voltage gain at a low or high level of the input signal.

Namely, referring to the graph of FIG. 6, it will be readily appreciated that the voltage gain curves 61 and 63 respectively representing the voltage gain characteristics of the circuits of FIGS. 2 and 3 rapidly drop when the level of the input voltage is below 2 V or over 3 V. The reason is that because the parts for receiving the input voltages in the circuits of FIGS. 2 and 3 are NMOS transitors, the voltage level region (or bandwidth) for maintaining high output voltage gain as described above is narrow.

Moreover, in the conventional circuits of FIGS. 1 or 3, if the sense amplifier control signal 10 is caused to become the logic "low" in order to prevent power consumption when the sense amplifier is not operated, the NMOS transistor 11 is turned off thereby disconnecting the currents flowing through the NMOS transistors 8, 9 or 58, 59 and the voltages of the first and second output terminals 3, 4 or 53, 54 rise until the PMOS transistors 6, 7 or 56, 57 are turned off.

Thus, the voltage levels of both output terminals come to have the same value, so that the loss of the originally effective output signal of the sense amplifier will be caused. In order to solve this problem, a lacth circuit may be additionally added between the first and second output terminals 3, 4 or 53, 54.

SUMMARY OF THE INVENTION

It is accordingly an object of the present invention to a provide a differential sense amplifier for a semiconductor memory device, which has a high operation speed as well as a high voltage gain.

It is another object of the present invention to provide a differential sense amplifier, wherein the power consumption is prevented during the sense amplifier not being operated and an additional latch circuit is not required for maintaining the output voltage level.

It is still another object of the present invention to provide a differential sense amplifier, whereby a stable effective output voltage gain is obtained even at a low or high level of the input voltage.

According to an aspect of the present invention, a differential sense amplifier for amplifying a small voltage difference between a pair of input signals includes: a pair of first complementary drivers for producing signals of different states, which determine the logic level of the pair of input signals, in response to the pair of input signals and determining the voltage level including one of the pair of input signals; a pair of output terminals connected to the respective outputs of the pair of complementary driver; and a pair of a secodnd complementary driver connected between the pair of output terminals to respectively respond to the signals of different states of the first complementary driver.

According to another aspect of the present invention, a differential sense amplifier includes a first insulated gate field effect transistor with the channel connected to the power supply and the gate connected to a sense amplifier control signal, and a second insulated gate field effect transistor with the channel connected to the ground voltage and the gate connected to the inverted signal of the sense amplifier control signal.

According to still another aspect of the present invention, a differential sense amplifier with first and second output terminals includes at least a pair of insulated gate field effect transistors complementarily driven according to the voltages of the first and second output terminals.

The present invention will now be described more specifically with reference to the drawings attached only by way of example.

DETAILED DESCRIPTION OF THE PREFERRED EMBODIMENTS

Figure 4:
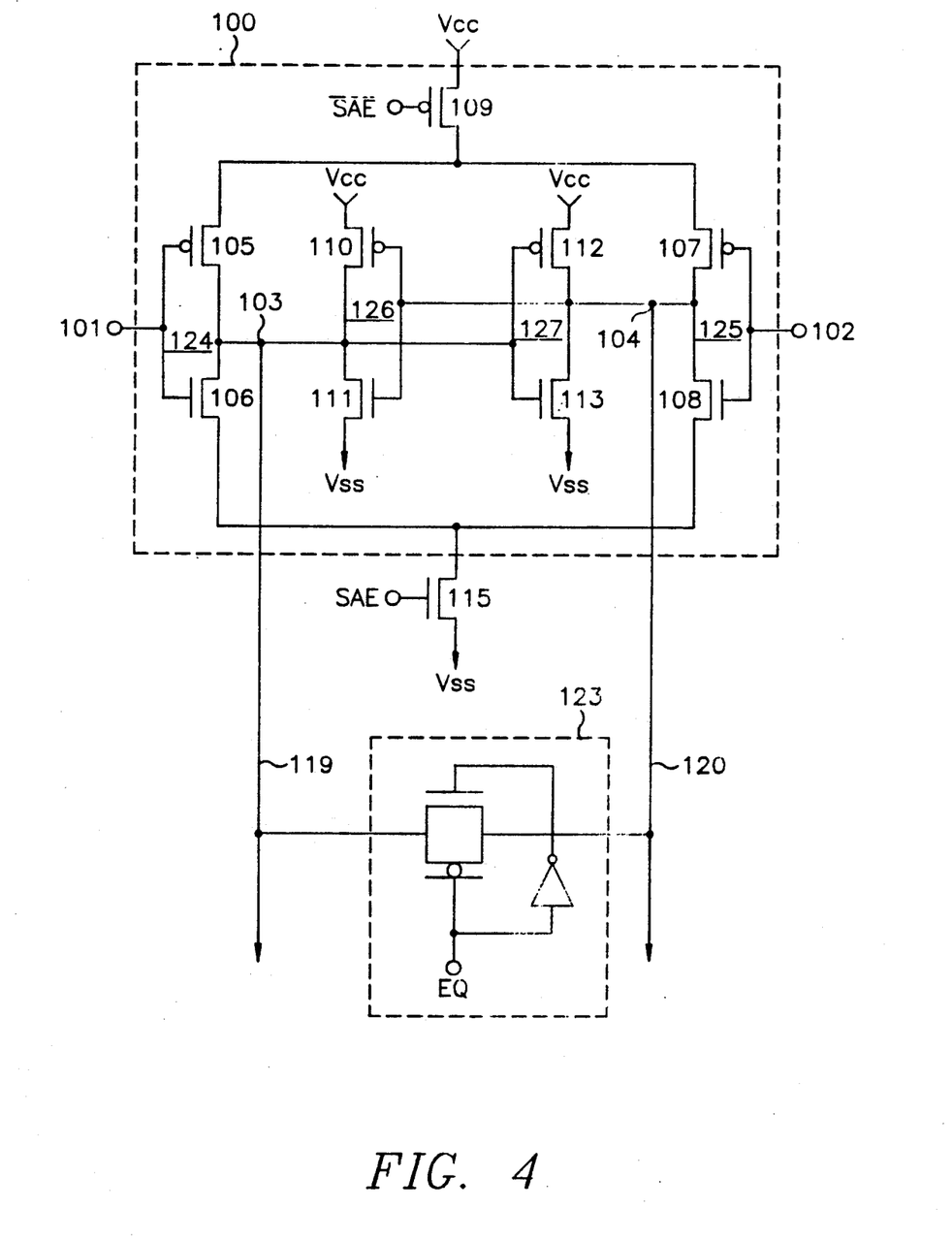
FIG. 4 illustrates a differential sense amplifier according to the present invention.

Referring to FIG. 4, a differential sense amplifier 100 includes a first complementary input inverter 124 with a first input terminal 101, and a second complementary input inverter 125 with a second input terminal 102. The first complementary input inverter 124 consists of PMOS and NMOS transistors 105 and 106 coupled in series. The second complementary input inverter 125 consists of PMOS and NMOS transistors 107 and 108 coupled in series. The first complementary input inverter 124 also has an output connected with a first output terminal 103, which in turn is coupled to the output of a first complementary inverter 126 and the input of a second complementary inverter 127. The second complementary input inverter 125 also has an output connected with a second output terminal 104, which in turn is connected with the output of the second complementary inverter 127 and the input of the first complementary inverter 126. The first 126 consists of EPMOS and NMOS transistors 110 and 111 connected in series. The second complementary inverter 127 consists of PMOS and NMOS transistors 112 and 113. To the common sorce of the PMOS transistors 105 and 107 of the first and second complementary input inverters 124 and 125, the power Vcc is supplied through the channel of a PMOS transistor 109 with the gate receiving a negative sense amplifier control signal $\overline{SAE}$. Also between the common source of the NMOS transistors 106 and 108 of the first and second complementary input inverters 124 and 125 and the ground voltage Vss is connected the channel of a NMOS transistor 115 with the gate receiving a positive sense amplifier control signal SAE. The first and second output terminals 103 and 104 are respectively connected with a pair of data lines 119 and 120. An equalization circuit 123 is connected between the data lines 119 and 120, and has the same function as that of FIGS. 1, 2 and 3.

The PMOS and NMOS trasistors 109 and 115 respectively connected with the power supply Vcc and the ground voltage Vss are turned off in response to the positive sense amplifier control signal SAE of the logic "low" state (or the negative sense amplifier control signal $\overline{SAE}$ of the logic "high" state) so as to prevent power consumption when the differential sense amplifier (hereinafter referred to as "sense amplifier") is not operated (standby state). Additionally, the first and second complementary inverters 126 and 127 serve as a latch circuit.

Figure 5:
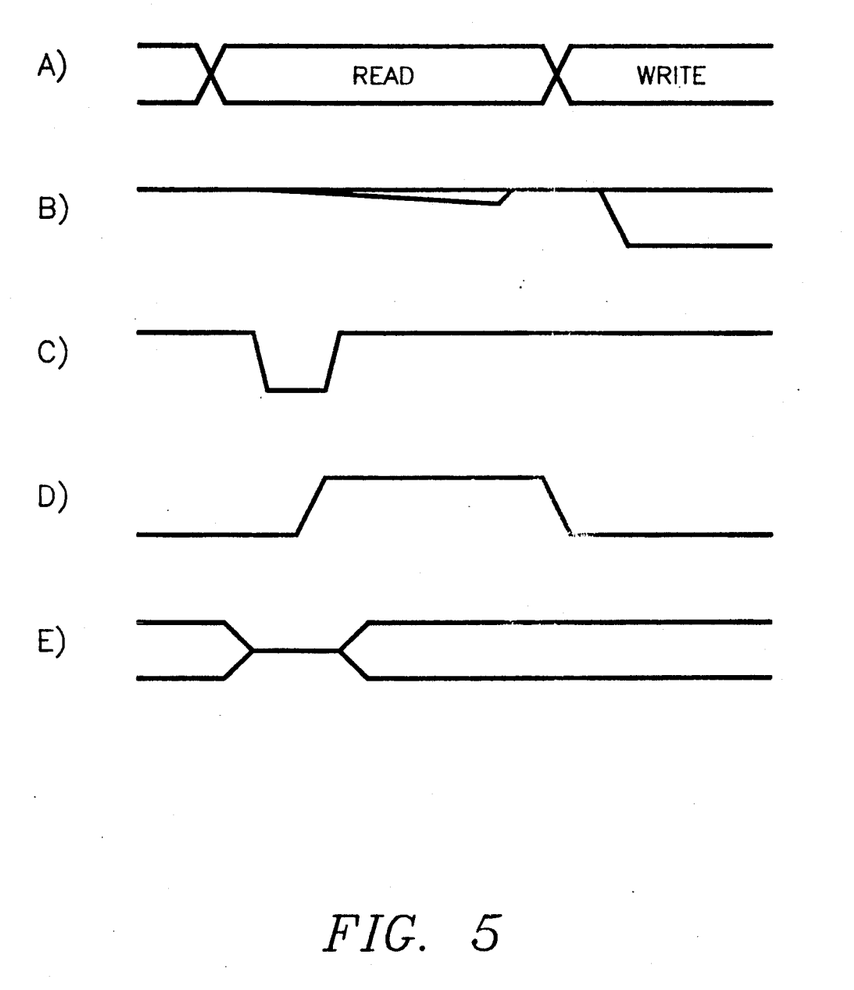
FIG. 5 shows the operational waveform of the sense amplifier of FIG. 4.

Referring to FIG. 5 for illustrating the operational waveforms of the sense amplifier of FIG. 4, reference letter A represents address signal, B the level of the input signal, C equalization signal EQ applied to the equalization circuit 123 to equalize the data line pair, D the positive sense amplifier control signal SAE, and E the output signal.

Figure 6:
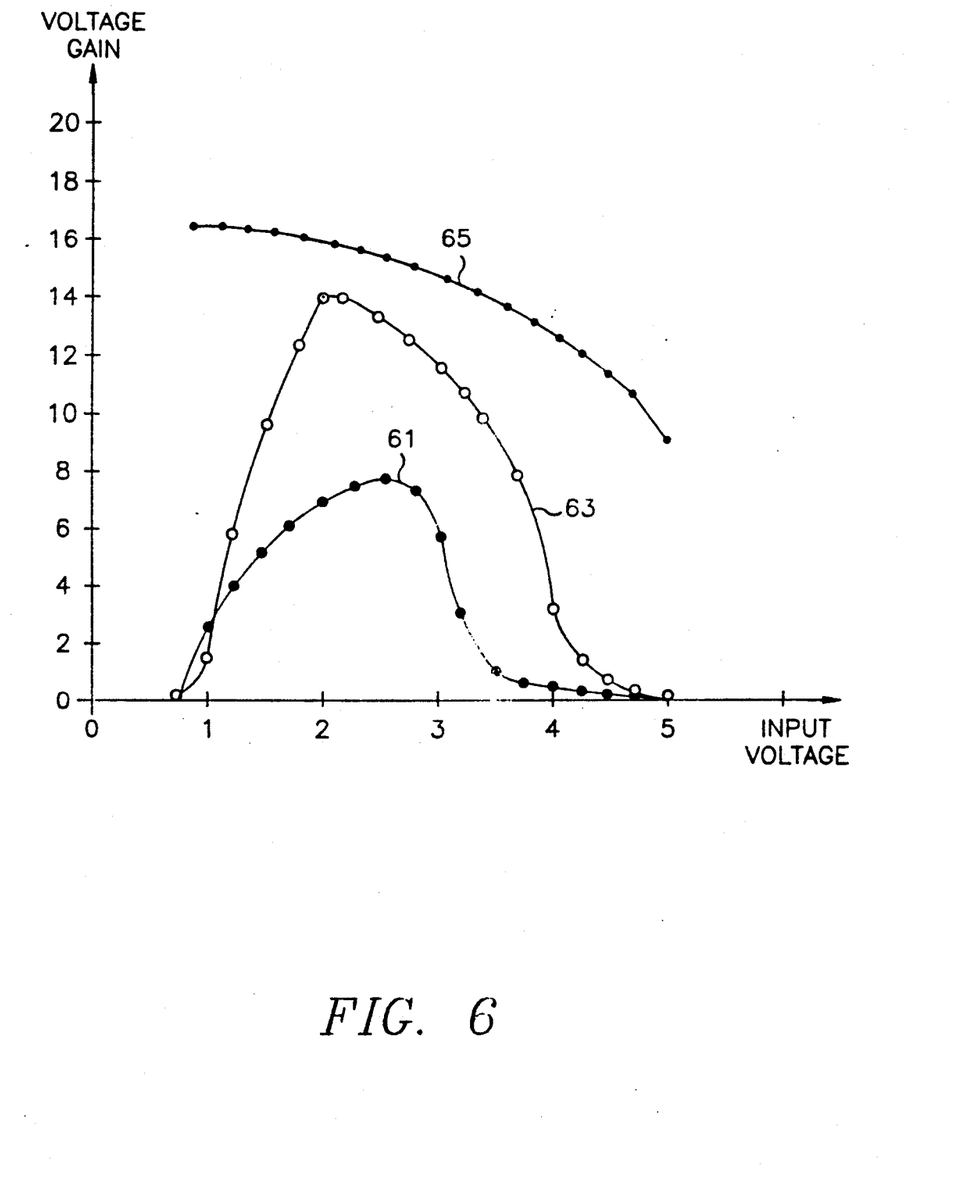
FIG. 6 shows the curves of comparing the characteristic of the inventive circuit with that of the conventional circuits.

In the graph of FIG. 6 for illustrating the results of comparing the conventional sense amplifiers of FIGS. 2 and 3 with the inventive sense amplifier of FIG. 4, the y-axis represents the voltage gain of the sense amplifier, and the x-axis the level of the input voltage. The curves 61, 63 and 65 respectively represent the results obtained by the sense amplifiers of FIGS. 2, 3 and 4. The results were obtained under the same power supply voltage.

Figure 7:
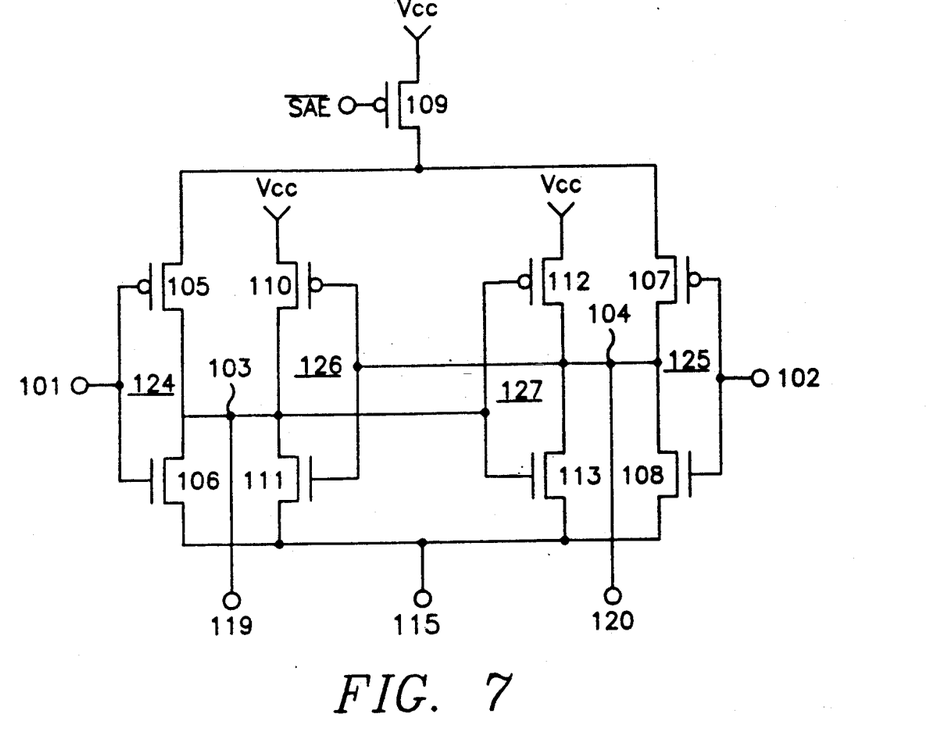
FIGS. 7 through 12 illustrate various embodiments of the inventive circuit.

FIG. 7 illustrates another embodiment of the invention, which differs from FIG. 4 in that the first and second complementary inverters 126 and 127 of FIG. 7 are connected through the NMOS transistor 115 to the ground voltage together with the first and second complementary input inverters 124 and 125. However, the operations of the two circuits are substantially the same to each other.

Figure 8:
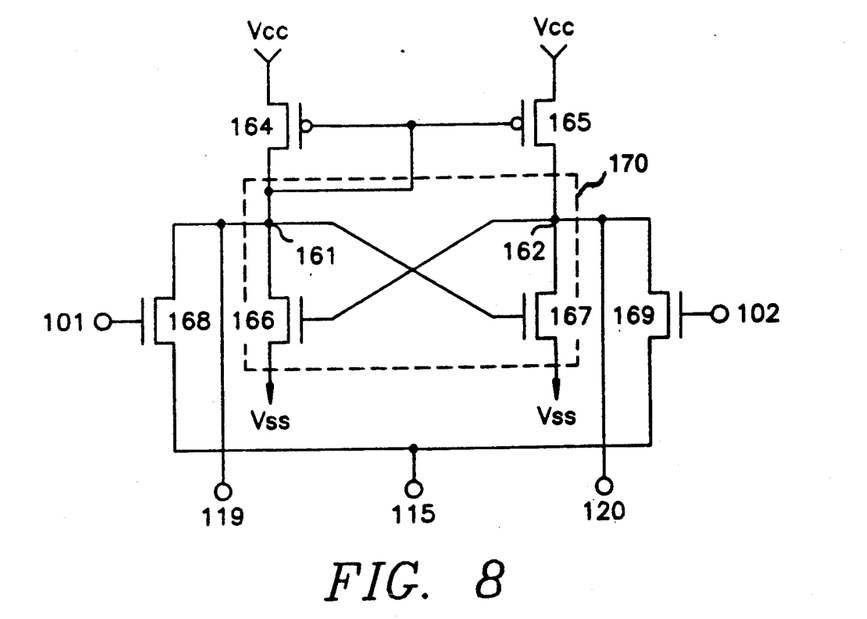

FIG. 8 is another embodiment of the invention, which combines a conventional current mirror type sense amplifier and latch circuit 170 including two NMOS transistors 166 and 167. The NMOS transistor 166 has the channel connected between the first output terminal 161 and ground voltage Vss and the gate connected to the second output terminal 162. The other NMOS transistor 167 has the channel connected between the second output terminal 162 and the ground voltage Vss and the gate connected to the first output terminal 161.

Figure 9:
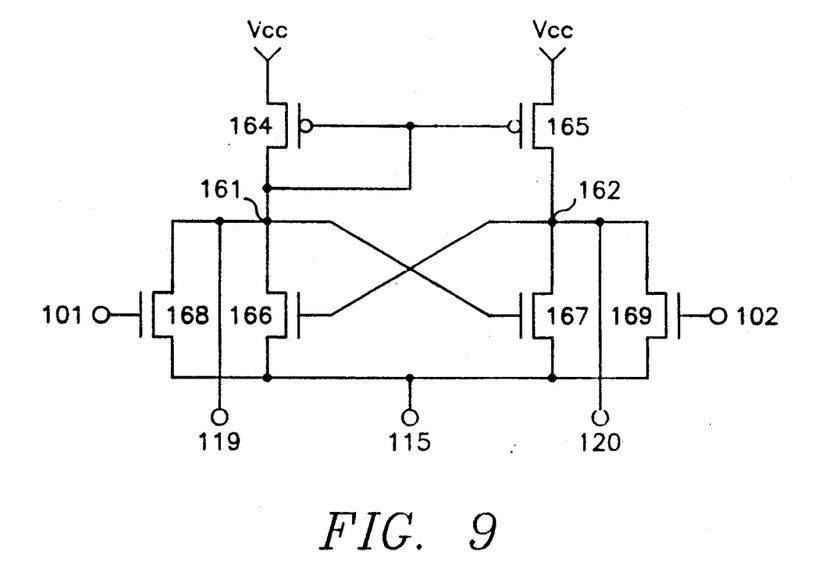

The sense amplifier of FIG. 9 differs from FIG. 8 in that the sources of the NMOS transistors 166 and 167 of FIG. 9 are connected through the NMOS transistor 115 (shown for the terminal only) with the ground voltage Vss.

Figure 10:
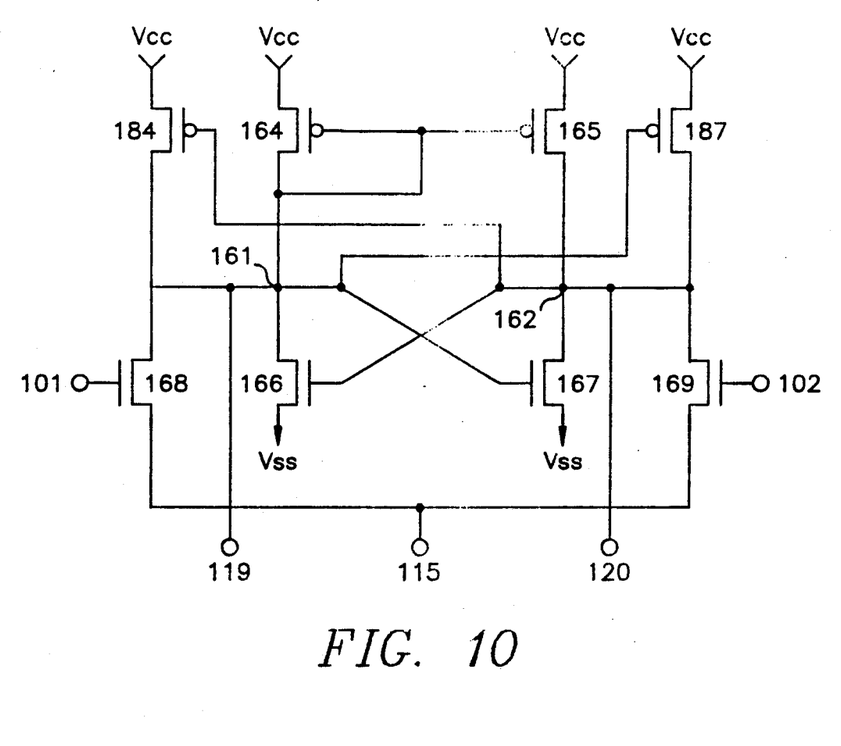

FIG. 10 illustrates another embodiment of the invention modified from FIG. 9. Namely, the sense amplifier of FIG. 10 is otained by adding two PMOS transistors 184 and 187 to FIG. 9. The channel of the PMOS transistor 184 is connected between the power supply voltage Vcc and the drain of the input NMOS transistor 168 whose gate is connected with the first input terminal 101, and the gate thereof connected with the second output terminal 162, while the channel of the other PMOS transistor 187 is connected between the power supply voltage Vcc and the drain of the other input NMOS transistor 169 whose gate is connected with the second input terminal 102, and the gate thereof connected with the first output terminal 161. Thus, the positive feedback effect is enhanced so as to increase the output voltage gain.

Figure 11:
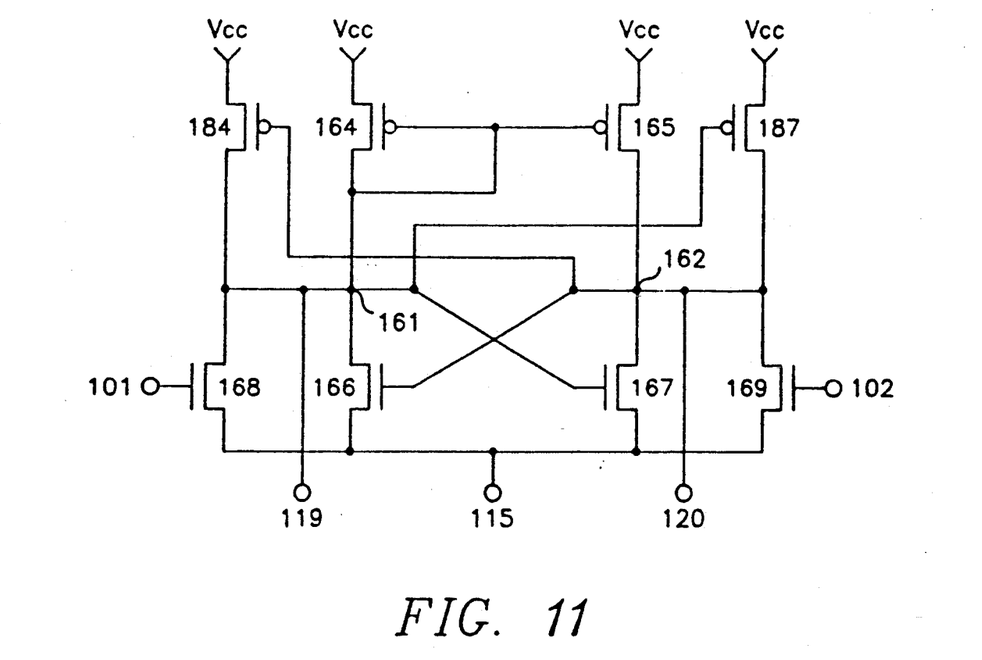

FIG. 11 differs from FIG. 10 only in that the sources of the two NMOS transistors 166 and 167 forming the latch circuit are commonly connected with the drain of the ground connected NMOS transistor 115 (shown for the terminal only) together with the sources of the input NMOS transistors 168 and 169.

Referring to FIGS. 4, 7, and 8-11 for illustrating various embodiments of the inventive sense amplifier, FIG. 4 is substantially the same to FIG. 7 except for the ground connection, FIG. 8 to FIG. 9, and FIG. 10 to FIG. 11.

The circuits of FIGS. 4 and 7 receive the input signals via CMOS inverter circuits (i.e., the complementary input inverters 124, 125), FIGS. 8 and 9 include a latch circuit formed of two NMOS transistors 166 and 167 between both output terminals of the conventional current mirror type sense amplifier, and the circuits of FIGS. 10 and 11 form a positive feedback loop by two NMOS transistors 184 and 187 connected to the power supply voltage.

Figure 12:
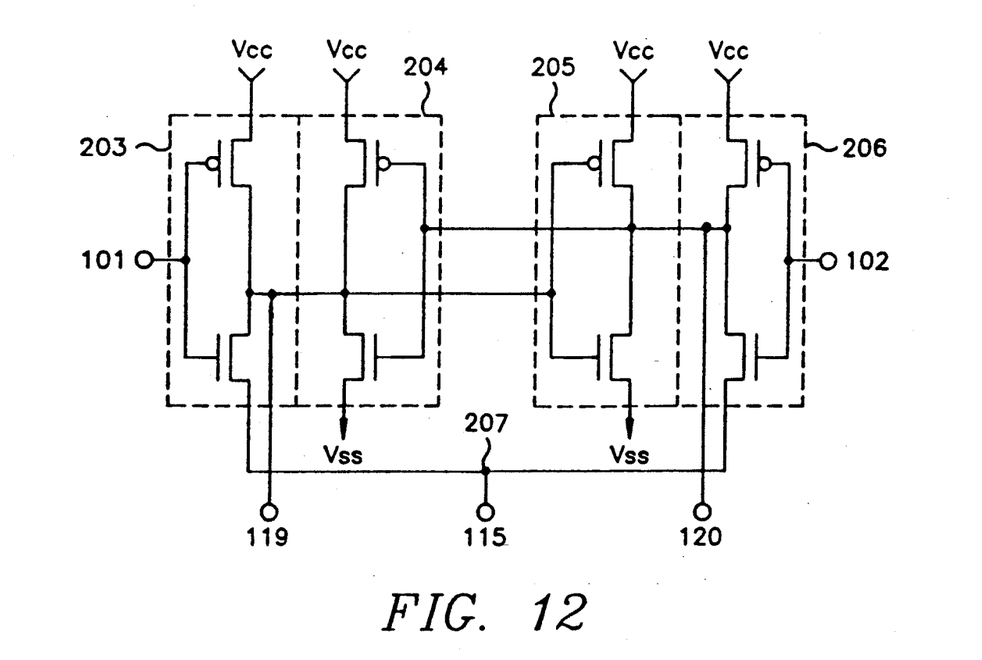

Referring to FIG. 12 for illustrating another embodiment of the inventive sense amplifier, unlike the circuits of FIGS. 4 and 7, the PMOS transistor 109 used for the power supply voltage connection is not included. Besides the above embodiments, it will be readily appreciated by one skilled in this art that various other embodiments may be obtained without departing from the gist of the present invention.

Hereinafter, the operation of the inventive sense amplifier will now be described with reference to FIGS. 4 and 5.

Before the operation of the sense amplifier 100, the equalization signal (EQ) C of the logic "low" state enables the equalization circuit 123 to equalize the pair of data lines 119 and 120 into a given level. In the case of SRAM, the equalization level of the data lines is generally the level of the power supply voltage Vcc, and more or less of it.

If the data lines are equalized, the sense amplifier control signal (SAE) D of the logic "high" state enables the sense amplifier 100 to perform the sensing function.

Assuming the signal level of the first input terminal 101 is higher than that of the second input terminal 102, the output of the first input inverter 124 gradually comes to a low level, while the output of the second input inverter 125 comes to a higher level than the output of the first input inverter 124. Namely, the NMOS transistor 106 of the first input inverter 124 conducts more currents via the NMOS transistor 115 into ground, while the NMOS transistor 108 of the second input inverter 125 conducts less currents than the NMOS transistor 106 via the NMOS transistor 115 into ground.

Then, the voltage level of the first output terminal 103 becomes lower than that of the second output terminal 104, and therefore the output of the second inverter 127 gets into more "higher" state due to positive feedback effect. Since the output of the second inverter 127 is coupled to the input of the first inverter 126, the output of the first inverter 126 comes more and more to the logic "low" state. As a result, the present state is kept stable as long as the voltage levels of the first and second input terminals 101 and 102 are not changed.

In addition, when the voltage level of the first output terminal 103 is decreased and that of the second output terminal 104 is increased, the NMOS transistor 113 of the second inverter 127 and the PMOS transistor 110 of the first inverter 126 are turned off, so that the DC current consumed via the first and second inverters 126 and 127 is prevented. Alternatively, if the voltage level of the first input terminal 101 is lower than that of the second input terminal 102, the same effect is also obtained.

Thus, the sufficiently amplified output signal E is loaded in the pair of bit lines (or data lines) 119 and 120 via the first and second output terminals 103 and 104. The output voltage gain of the sense amplifier of FIG. 4 is kept stable without considerable change even at low or high level (lower than about 2 V or higher than about 3 V) of the input voltage, as shown by the curve 65 in the graph of FIG. 6.

The sense amplifier of FIG. 7 is operated in the substantially same manner as that of FIG. 4 except for the ground connection of the first and second inverters 126 and 127.

The sense amplifier of FIG. 8 does not use the first and second input inverters 124 and 125 as in FIGS. 4 and 7. Instead the latch circuit 170 formed of the two NMOS transistors 166 and 167 produces the positive feedback effect, thus obtaining stable output voltage gain that is similar to the curve 65 of FIG. 6.

Namely, if the voltage level of the first input terminal 101 is higher than that of the second input terminal 102, the voltage level of the first output terminal 161 drops faster than the voltage level of the second output terminal 162, so that the NMOS transistor 167 is turned off due to its gate being connected with the first output terminal 161. Meanwhile, the two PMOS transistors 164 and 165 are turned on due to low voltage level of the first output terminal 161 so as to charge the output terminals with the power supply voltages Vcc. Further, since the PMOS transistor 164 is a gate-drain commonly connected type to work in the saturation region, its charging operation is hardly done compared to the PMOS transistor 165 with the drain connected to the second output terminal 162. Hence, the voltage level of the second output terminal 162 becomes high so as to turn on the NMOS transistor 166. Consequently, the voltage level of the output terminal 161 gets into the logic "low" state, while the voltage level of the second output terminal 162 maintains the logic "high" state. Thus, there is obtained the output voltage state E as shown in FIG. 5.

In addition, the PMOS transistor 164 hardly conducts the direct current (dc) current of the power supply voltage because of being operated in the saturation region, and the other PMOS transistor 165 cannot conduct a current through its channel because of the high voltage of the second output terminal 162, thus preventing consumption of the dc current.

In the sense amplifier of FIG. 10, assuming the voltage level of the first input terminal 101 is higher than that of the second input terminal 102, the PMOS transistors 187 and 184 respond to the "low" voltage of the first output terminal 161 and the "high" voltage of the second output terminal 162 so as to enhance the positive feedback effect, so that the response speed of the output voltage may be more sped up. Namely, the "high" voltage of the second output terminal 162 turns off the PMOS transistor 184, while the "low" voltage of the first output terminal 161 turns on the other PMOS transistor 187, so that the second output terminal 162 may be more quickly charged into the level of the power supply voltage Vcc.

On the contrary, if the voltage level of the first input terminal 101 is lower than that of the second input terminal 102, the PMOS transistor 184 more quickly charges the first output terminal 161 into the level of the power supply voltage.

From the above description of the embodiments of the present invention, it will be readily appreciated to a person skilled in the art that the sense amplifier of FIG. 11 works substantially in the same manner as that of FIG. 10. Also the sense amplifier of FIG. 12 works substantially in the same manner as those of FIGS. 4 and 7. Various other embodiments of the present invention may be obtained without departing the gist of the present invention.

As desribed above, the inventive sense amplifier uses CMOS inverter circuits for receiving input signals so as to amplify the voltage difference between the input signals, thus expanding the effective operation region of the sense amplifier.

Additionally, the inventive sense amplifier responds to the voltage levels of both output terminals so as to maintain stable output signal with a large gain and increase the speed of operation.

Moreover, the present invention provides means for preventing the DC current between the power supply and ground in inoperative state of the sense amplifier, thus reducing power consumption.

What is claimed is:

1. A differential sense amplifier for amplifying a small voltage difference between a pair of input signals comprising:
 a pair of first complementary drive means for producing signals of different states in response to said pair of input signals, and for determining the voltage level difference between said pair of input signals for output;
 a pair of output terminals connected with the respective outputs of said pair of first complementary drive means; and
 a pair of a second complementary drive means connected between said pair of output terminals to respectively respond to said signals of different states of said first complementary drive means for stabilizing said voltage level difference determined by said first complementary means.

2. A differential sense amplifier as claimed in claim 1, wherein each of said pair of first complementary drive means comprises at least two insulated gate transistors connected in series, said insulated gate transistors having different operating voltages.

3. A differential sense amplifier as claimed in claim 1, further comprising:
 said pair of first complementary drive means being connected between a power supply voltage and a ground voltage; and
 first switching means coupled between the ground voltage and said pair of first complementary drive means, said first switching means being operated according to a given control signal.

4. A differential sense amplifier as claimed in claim 3, further comprising:
 second switching means connected between said pair of first complementary drive means and the supply voltage, said second switching means being switched according to a given control signal.

5. A differential sense amplifier as claimed in claim 1, wherein the inputs/outputs and outputs/inputs of said pair of second complementary driving means are cross-coupled to each other, said inputs/outputs and outputs/inputs being coupled to said pair of output terminals.

6. A differential sense amplifier as claimed in claim 1, wherein each of said pair of second complementary drive means comprises at least two insulated gate transistors connected in series, said insulated gate transistors having different operating voltages.

7. A differential sense amplifier as claimed in claim 1, wherein said pair of second complementary drive means is between the power supply voltage and the ground voltage.

8. A differential sense amplifier as claimed in claim 5, wherein each of said pair of second complementary drive means comprises at least two insulated gate transistors connected in series, said insulated gate transistors aving different operating voltages.

9. A differential sense amplifier as claimed in claim 1 further comprising:
 switching means coupled between said pair of first complementary drive means and the supply voltage, said switching means being coupled to be switched according to a control signal.

10. A differential sense amplifier comprising:
 first inverting means having a first input terminal and a first output terminal connected to a first bit line;
 second inverting means having a second input terminal and a second output terminal connected to a second bit line;
 third inverting means having an input connected to said second output terminal and an output connected to said first output terminal; and
 fourth inverting means having an input connected to said first output terminal and an output connected to said second output terminal;
 wherein said first and second inverting means determine logic levels of a pair of input signal supplied to said first and second input terminals and provide output signals in response to the difference between said determined logic levels and wherein said third and fourth inverting means stabilize said output signals.

11. The differential sense amplifier as claimed in claim 10, wherein said first inverting means comprises;
a first p-channel metal oxide semiconductor transistor and a first n-type metal oxide semiconductor transistor coupled in series, at a first mode, between a supply voltage and a reference voltage, respectively, wherein said first input terminal is coupled to gates of said first p-channel metal oxide semiconductor transistor and said first n-type metal oxide semiconductor transistor and said first mode is coupled to said first output terminal.

12. The differential sense amplifier as claimed in claim 11, wherein said second inverting means comprises;
a second p-channel metal oxide semiconductor transistor and a second n-type metal oxide semiconductor transistor coupled in series, at a second node, between said supply voltage and said reference voltage, respectively, wherein said second input terminal is coupled to gates of said second p-channel metal oxide semiconductor transistor and said second n-type metal oxide semiconductor transistor, and said second node is coupled to said output terminal.

13. The differential sense amplifier as claimed in claim 12, wherein said third inverting means comprises a third p-channel metal oxide semiconductor transistor and a third n-type metal oxide semiconductor transistor coupled in series, at a third node, between a supply voltage and reference voltage, respectively, said third node being said output of said third inverting means, said third node being connected to said input of said fourth inverting means, and
wherein said fourth inverting means comprises a fourth p-channel metal oxide semiconductor transistor and fourth n-type metal oxide semiconductor transistor coupled in series, at a fourth node, between a supply voltage and a reference voltage, respectively, said fourth node being output of said fourth inverting means, said fourth node being connected to said input of said third inverting means.

14. The differential sense amplifier as claimed in claim 12, further comprising:
said first and second n-type metal oxide semiconductor transistors being connected to said reference voltage through a first sense amplifier control said reference voltage through a sense amplifier control means coupled between said reference voltage and said first and second n-type metal oxide semiconductor transistor for controlling operation of said differential sense amplifier in response to a positive control signal.

15. The differential sense amplifier as claimed in claim 13, further comprising:
said first, second, third and fourth NMOS transistors being connected to said reference voltage through a first sense amplifier control means for controlling operation of said differential sense amplifier in response to a positive control signal; and
said first and second PMOS transistors being connected to said supply voltage through a second sense amplifier control means for controlling operation of said differential sense amplifier in response to a negative control signal.

16. The differential sense amplifier as claimed in claim 13, further comprising:
said first and second NMOS transistors being connected to said reference voltage through a sense amplifier control means coupled between said reference voltage and said first and second NMOS transistors for controlling operation of said differential sense amplifier in response to a positive control signal.

17. A differential sense amplifier, having first and second input terminals and first and second output terminals, comprising:
a current mirror differential sense amplifier connected between said first and second input terminals for amplifying differences between voltages applied to said first and second input terminals for output through said first and second output terminals; and
latch means connected between said first and second output terminals for stabilizing said amplified differences output through said first and second output terminals, said latch means comprising:
a first n-type metal oxide semiconductor transistor having a channel connected between said first output terminal and a reference voltage and a gate connected to said second output terminal; and
a second n-type metal oxide semiconductor transistor having a channel connected between said second output terminal and said reference voltage and a gate connected to said first output terminal.

18. The differential sense amplifier as claimed in claim 17, further comprising a sense amplifier control means responsive to a positive control signal, said sense amplifier control means being connected between said reference potential and said first and second n-type metal oxide semiconductor transistors, said sense amplifier control means being further connected between said reference voltage and said current mirror differential sense amplifier.

19. The differential sense amplifier as claimed in claim 17 further comprising:
a first p-channel metal oxide semiconductor transistor having a channel connected between a supply voltage and said first output terminal and a gate connected to said second output terminal; and
a second p-channel metal oxide semiconductor transistor having a channel connected between said supply voltage and said second output terminal and a gate connected to said first output terminal.

20. The differential sense amplifier as claimed in claim 18 further comprising:
a first p-channel metal oxide semiconductor transistor having a channel connected between a supply voltage and said first output terminal and a gate connected to said second output terminal; and
a second p-channel metal oxide semiconductor transistor having a channel connected between said supply voltage and said second output terminal and a gate connected to said first output terminal.

21. A differential sense amplifier for amplifying voltage differences between first and second input signals received at input terminals, comprising:
a first complementary input inverter having a first p-channel metal oxide semiconductor transistor and a first n-type metal oxide semiconductor transistor coupled in series at a first node and between a power supply voltage and a ground voltage, wherein said first input signal is applied to a gate of each of said first p-channel metal oxide semiconductor and n-type metal oxide semiconductor transistors;

a second complementary input inverter having second p-channel metal oxide semiconductor transistor and a second n-type metal oxide semiconductor transistor coupled in series at a second node and between said power supply voltage and a ground voltage, wherein said second input signal is applied to a a gate of each of said second p-channel metal oxide semiconductor and n-type metal oxide semiconductor transistors;

said first and second complementary input inverter determining a voltage level difference between said first and second input signals;

first and second output terminals connected to said first and second nodes for respectively receiving output signals of said first and second complementary input inverters; and a third complementary input inverter having a third p-channel metal oxide semiconductor transistor and a third n-type metal oxide semiconductor transistor coupled at a third node and in series between said power supply voltage and a ground voltage, wherein said third node is connected to said first output terminal;

a fourth complementary input inverter having a fourth p-channel metal oxide semiconductor transistor and a fourth n-type oxide semiconductor transistor coupled at a fourth node and in series between said power supply voltage and said ground voltage, wherein said fourth node is connected to said second output terminal;

said third and fourth complementary input inverter stabilizing said voltage level difference determined by said first and second complementary input inverters.

22. A differential sense amplifier as claimed in claim 21, further comprising:

a first switch transistor, responsive to a given control signal, being connected between said ground voltage and said first and second n-type metal oxide semiconductor transistors.

23. A differential sense amplifier as claimed in claim 22, further comprising:

a second switching transistor, responsive to a control signal complementary to said given control signal, being connected between said power supply voltage and said first and second p-channel metal oxide semiconductor transistors.

24. A differential sense amplifier as claimed in claim 21, further comprising:

a switch transistor, responsive to a control signal, being connected between said power supply voltage and said first and second p-channel metal oxide semiconductor transistors.

25. A differential sense amplifier, having first and second input terminals and first and second output terminals, comprising:

a current mirror differential sense amplifier connected between said first and second input terminals for amplifying differences between voltages applied to said first and second input terminals for output through said first and second output terminals;

a first NMOS transistor having a channel connected between said first output terminal and a reference voltage and a gate connected to said second output terminal; and a second NMOS transistor having a channel connected between said second output terminal and said reference voltage and a gate connected to said first output terminal;

said first and second NMOS transistors stabilizing said amplified differences output through said first and second output terminals.

26. The differential sense amplifier as claimed in claim 25, further comprising a sense amplifier control means responsive to a positive control signal, said sense amplifier control means being connected between said reference potential and said first and second NMOS transistors, said sense amplifier control means being further connected between said reference voltage and said current mirror differential sense amplifier.

27. The differential sense amplifier as claimed in claim 25, further comprising:

a first p-channel metal oxide semiconductor transistor having a channel connected between a supply voltage and said first output terminal, and having a gate connected to said second output terminal; and a second p-channel metal oxide semiconductor transistor having a channel connected between said supply voltage and said second output terminal, and having a gate connected to said first output terminal.

28. The differential sense amplifier as claimed in claim 26, further comprising:

a first p-channel metal oxide semiconductor transistor having a channel connected between a supply voltage and said first output terminal, and having a gate connected to said second output terminal; and a second p-channel metal oxide semiconductor transistor having a channel connected between said supply voltage and said second output terminal, and having a gate connected to said first output terminal.

* * * * *

UNITED STATES PATENT AND TRADEMARK OFFICE
CERTIFICATE OF CORRECTION

Page 1 of 2

PATENT NO. : 5,162,681
DATED : November 10, 1992
INVENTOR(S) : Jeong-Ryeol LEE

It is certified that error appears in the above-indentified patent and that said Letters Patent is hereby corrected as shown below:

Column 1, Line 16, after "circuit", insert --for--;

Column 2, Line 4, before "voltage", change "out put" to --output--;

Line 25, after "the" in second occurrence, insert --voltage--;

Line 36, after "first", change "states" to --stated--;

Column 4, Line 15, before " 126 ", insert --inverter--;

Column 5, Line 3, before "latch", insert -- a --;

Column 6, Line 63, before "low", insert --the--;

Column 8, Line 48, before "different", change "aving" to --having--;

UNITED STATES PATENT AND TRADEMARK OFFICE
CERTIFICATE OF CORRECTION

PATENT NO. : 5,162,681
DATED : November 10, 1992
INVENTOR(S) : Jeong-Ryeol LEE

It is certified that error appears in the above-indentified patent and that said Letters Patent is hereby corrected as shown below:

Column 9,    Line 15,    after "first", change "mode" to --node--;

Line 56,    before "for", change "transistor" to --transistors--;

Column 10,   Line 66,    after "at", insert --respective--;

Column 11,   Line 15,    before "gate", delete " a " in second occurrence.

Signed and Sealed this

Third Day of September, 1996

*Attest:*

BRUCE LEHMAN

*Attesting Officer*   *Commissioner of Patents and Trademarks*